United States Patent
Leong et al.

(10) Patent No.: US 8,456,241 B1
(45) Date of Patent: *Jun. 4, 2013

(54) METHOD AND APPARATUS FOR IMPROVING AMPLIFIER LINEARITY

(75) Inventors: Poh Boon Leong, Singapore (SG); Ping Song, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,263

(22) Filed: Jul. 11, 2012

Related U.S. Application Data

(63) Continuation of application No. 12/840,801, filed on Jul. 21, 2010, now Pat. No. 8,242,847.

(60) Provisional application No. 61/231,405, filed on Aug. 5, 2009, provisional application No. 61/231,410, filed on Aug. 5, 2009.

(51) Int. Cl.
*H03F 3/04* (2006.01)

(52) U.S. Cl.
USPC .......................... 330/311; 330/295; 330/149

(58) Field of Classification Search
USPC ............. 330/149, 310–311, 124 R, 295, 151
See application file for complete search history.

(56) References Cited

U.S. PATENT DOCUMENTS

| | | | |
|---|---|---|---|
| 7,332,961 B2 | 2/2008 | Blednov | |
| 7,663,441 B2 | 2/2010 | Kang | |
| 7,696,828 B2 | 4/2010 | Chang | |
| 7,936,220 B2 | 5/2011 | Li et al. | |

OTHER PUBLICATIONS

Tanaka, S., et al., "A Linearization Technique for CMOS RF Power Amplifiers," Electrical Engineering Department, University of California Los Angeles, Los Angeles, CA, pp. 1-2.

Mirzaie, A., et al., "A 65nm CMOS Quad-Band SAW-Less Receiver for GSM/GPRS/EDGE," 2010 Symposium on VLSI Circuits/Technical Digest of Technical Papers, pp. 179-180.

*Primary Examiner* — Hieu Nguyen

(57) ABSTRACT

Aspects of the disclosure provide an amplifier. The amplifier includes a first path, a second path and a drain bias circuit. The first path includes a first transistor that operates in a saturation region to generate a first current in response to an input signal. The first current has a first polarity third-order coefficient. The second path includes a second transistor that generates a second current in response to the input signal. The drain bias circuit is configured to bias a drain terminal of the second transistor separately from the first transistor such that the second transistor operates in a linear region to generate the second current having a second polarity third-order coefficient. The second current is combined with the first current to reduce a third-order inter-modulation in the combined current.

20 Claims, 8 Drawing Sheets

| INPUT POWER | CONTROL_A | CONTROL_B | CONTROL_S |
|---|---|---|---|
| < 10dBm | | | |
| 11dBm | | | |
| 12dBm | | | |
| 13dBm | | | |
| 14dBm | | | |
| 15dBm | | | |
| 16dBm | | | |
| 17dBm | | | |
| 18dBm | | | |
| 19dBm | | | |
| 20dBm | | | |

FIG. 6

METHOD AND APPARATUS FOR IMPROVING AMPLIFIER LINEARITY

INCORPORATION BY REFERENCE

This application is a continuation of U.S. patent application Ser. No. 12/840,801, "Method and Apparatus for Improving Amplifier Linearity" filed on Jul. 21, 2010, which claims the benefit of U.S. Provisional Applications No. 61/231,405, "Techniques on Dynamic Tuning to Improve Amplifier Linearity Over Wide Input Signal Range" filed on Aug. 5, 2009, and No. 61/231,410, "Power Amplifier Linearity Improvement Under Large Input Power Signal" filed on Aug. 5, 2009. The entire disclosures of the above-identified applications are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Amplifiers are widely used in wireless communication. For example, a mobile device uses a power amplifier (PA) in a transmitting portion, and uses a low noise amplifier in a receiving portion. Both the power amplifier and the low noise amplifier may require a relatively high linearity over a relatively wide input signal range.

SUMMARY

Aspects of the disclosure provide an amplifier. The amplifier can achieve a third-order inter-modulation (IM3) reduction across a relatively wide input power range as well as a relatively large signal swing. The amplifier includes a first path configured to generate a first current that has a first polarity third-order coefficient corresponding to an input signal, a swing adjustor configured to adjust a swing of the input signal, and a second path configured to generate a second current based on the swing-adjusted input signal. The second current has a second polarity third-order coefficient corresponding to the swing-adjusted input signal. The first current and the second current are combined to reduce a third-order inter-modulation (IM3) in the combined current. Specifically, a first integration of the first polarity third-order coefficient and a second integration of the second polarity third-order coefficient offset each other to reduce the third-order inter-modulation (IM3) in the combined current.

In an embodiment, the first path includes a first main transistor that operates in a saturation region, and the second path includes a second main transistor that operates in a linear region. The swing adjustor is configured to attenuate the swing of the input signal.

Further, the amplifier includes a bias control module configured to provide a gate bias to at least the second path. Additionally, the amplifier includes more paths that operate based on the swing-adjusted input signal. In an example, the amplifier includes a third path configured to operate based on the swing-adjusted input signal, and a path switch control module configured to couple or decouple the third path with the load.

According to an aspect of the disclosure, the amplifier includes a detector configured to detect an input power of the input signal, and a controller configured to provide control signals to the swing adjustor, the gate bias control module, and the path switch control module based on the input power of the input signal. In an embodiment, the detector is configured to detect at least one of a peak value of the input signal, and an envelope of the input signal.

In an embodiment, the amplifier is configured as a power amplifier in a transceiver to amplify a signal for transmission. In another embodiment, the amplifier is configured as a low noise amplifier (LNA) in a transceiver to amplify a received signal.

Aspects of the disclosure provide a method for improving linearity of an amplifier. In an example, the method improves linearity of an amplifier at a relatively large signal power. In another example, the method improves linearity of an amplifier across a relatively large power range. The method includes receiving an input signal to the amplifier, generating by a first path a first current based on the input signal, adjusting a swing of the input signal, generating by a second path a second current based on the swing-adjusted input signal, and combining the first current with the second current to drive a load. The first current has a first polarity third-order coefficient corresponding to the input signal, and the second current has a second polarity third-order coefficient corresponding to the swing-adjusted input signal. When the first current and the second current are combined, a first integration of the first polarity third-order coefficient and a second integration of the second polarity third-order coefficient offset each other to reduce a third-order inter-modulation (IM3) distortion in the combined current.

In an embodiment, the method includes generating the first current based on the input signal by the first path that includes a first transistor biased in a saturation region, and generating the second current based on the swing-adjusted input signal by the second path that includes a second transistor biased in a linear region.

To adjust the swing of the input signal, in an example, the method includes attenuating the swing of the input signal.

In an embodiment, the second path is adjusted from various aspects. In an example, the method includes adjusting a gate bias to the second path. In another embodiment, the method includes switching on and off to couple and decouple respectively a third path that generates a third current.

According to an aspect of the disclosure, the method includes detecting an input power of the input signal, and at least one of attenuating the swing of the input signal based on the input power of the input signal, adjusting the gate bias to the second path based on the input power of the input signal, and switching on/off to couple/decouple the third path to/from the load based on the input power of the input signal.

BRIEF DESCRIPTION OF THE DRAWINGS

Various embodiments of this disclosure that are proposed as examples will be described in detail with reference to the following figures, wherein like numerals reference like elements, and wherein:

FIG. 6 shows a table of control signals vs. input power according to an embodiment of the disclosure.

DETAILED DESCRIPTION OF EMBODIMENTS

Figure 1A:
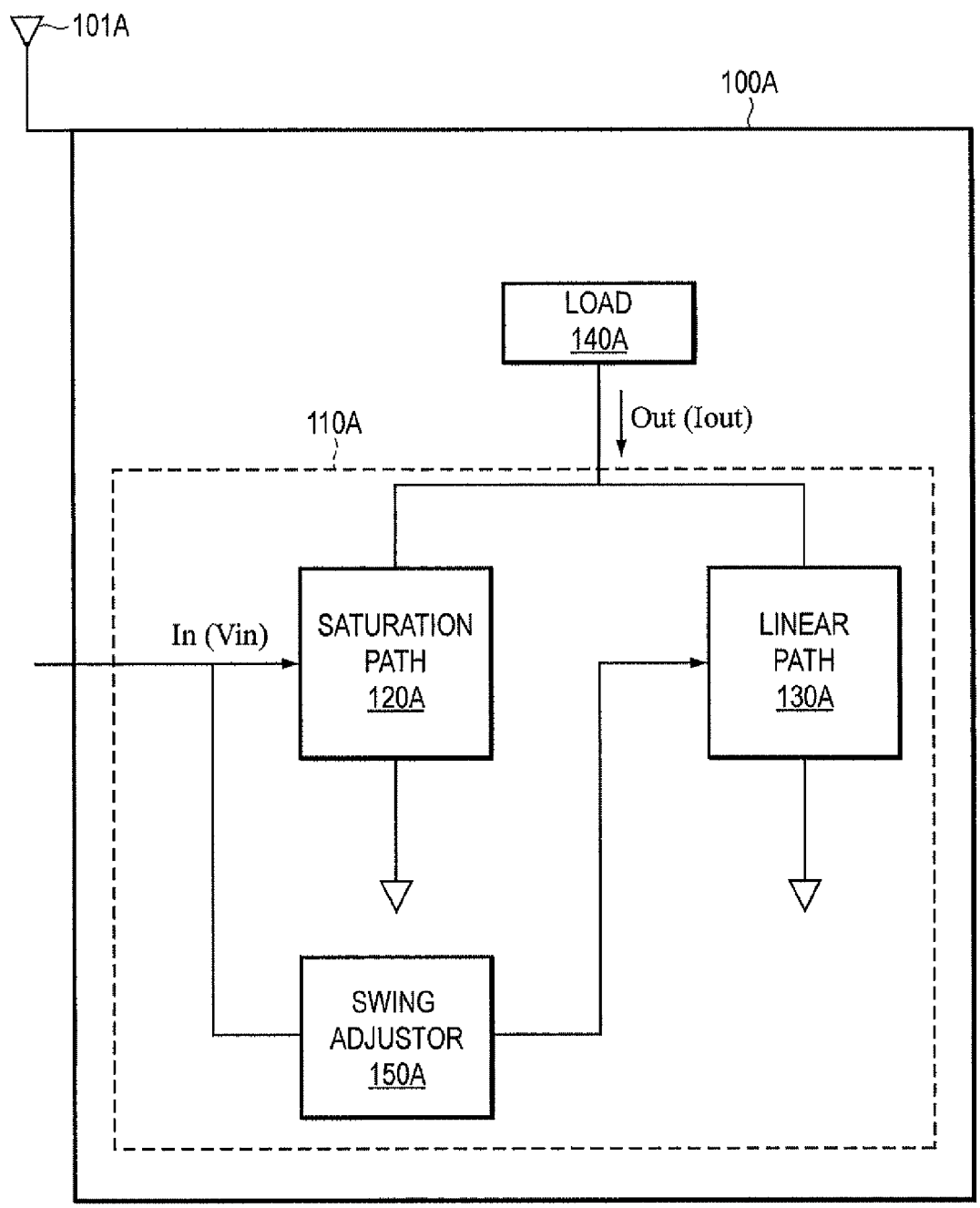
FIG. 1A shows a block diagram of an apparatus example according to an embodiment of the disclosure.

FIG. 1A shows a block diagram of an apparatus example 100A according to an embodiment of the disclosure. The apparatus 100A includes an amplifier 110A driving a load 140A. The amplifier 110A has an improved linearity for an input signal that has a relatively large input power, such as a relatively wide swing in radio frequency.

The apparatus 100A can be any suitable device that uses the amplifier 110A to amplify a signal. In an embodiment, the apparatus 100A is a wireless communication device, such as a cell phone, a laptop, and the like, that uses the amplifier 110A in a transceiver (not shown). In an example, the amplifier 110A is configured as a low noise amplifier (LNA) and is used in a receiving portion of the transceiver to amplify a signal received by an antenna 101A. In another example, the amplifier 110A is configured as a power amplifier (PA) and is used in a transmitting portion of the transceiver to amplify a signal for transmission by the antenna 101A.

The amplifier 110A receives an input signal, such as an input voltage (Vin), and generates an output signal, such as a current (Tout) passing through the load 140A. The load 140A can be any single circuit component, or multiple circuit components that receive the output signal, and operate in response to the output signal. In an example, the load 140A includes resistors, capacitors, transistors, and the like, for further processing the output signal. In another example, the load 140A includes an antenna, such as the antenna 101A, for transmitting the output signal. The gain of the amplifier 110A has a reduced third-order inter-modulation (IM3) distortion for the relatively large input power.

According to an embodiment of the disclosure, the third-order inter-modulation (IM3) distortion is caused by third-order coefficient in the amplifier response. Eq. 1 shows a Taylor expansion of an amplifier response up to the third-order:

$$y(t) = \alpha_1 A \cos\omega t + \alpha_2 A^2 \cos^2\omega t + \alpha_3 A^3 \cos^3\omega t$$

$$= \frac{\alpha_2 A^2}{2} + \left(\alpha_1 A + \frac{3\alpha_3 A^3}{4}\right)\cos\omega t + \frac{\alpha_2 A^2}{2}\cos 2\omega t + \frac{\alpha_3 A^3}{4}\cos 3\omega t$$

Eq. 1 where y(t) denotes an output of the amplifier, cos ωt denotes an input signal, $\alpha_1$ denotes the first order coefficient, $\alpha_2$ denotes the second order coefficient, $\alpha_3$ denotes the third-order coefficient. Generally, non-linearity due to the second order coefficient can be suppressed by suitably balancing input and output of an amplifier. The non-linearity due to the third-order coefficient causes a third-order inter-modulation (IM3) distortion that spills energy into the immediately adjacent channels. Thus, reducing the third-order coefficient can reduce energy spilled into the immediately adjacent channels, and make the immediately adjacent channels usable in wireless communication, for example.

In an example, when the third-order coefficient is relatively large, a wireless communication system has to use every other channel in a cell to ensure signal quality; and when the third-order coefficient is relatively small, a wireless communication system can use adjacent channels in the cell.

Third-order coefficient has different polarities when an amplifier, specifically a main transistor of the amplifier, operates in different regions. Thus, the third-order coefficient can be cancelled or reduced by using multiple transistors configured to operate in different regions. In an embodiment, to reduce the third-order coefficient, an amplifier includes two sub-amplifiers to operate in different regions to amplify a same input signal when the input signal has a relatively low input power. The two sub-amplifiers are configured to have opposite polarities of the third-order coefficient, such that the third-order coefficient for the amplifier can be suitably cancelled. In an example, a first sub-amplifier includes a first transistor that receives and amplifies the input signal, and a second sub-amplifier includes a second transistor that receives and amplifiers the input signal. The first transistor is biased in a saturation region that generates a first current having a negative third-order coefficient, and the second transistor is biased in a linear region that generates a second current has a positive third-order coefficient. Thus, when the first current and the second current are combined, the negative third-order coefficient and the positive third-order coefficient offset each other, and the combined current has a reduced third-order coefficient.

According to another embodiment of the disclosure, when the input signal has a relatively large input power, the input signal is suitably processed to generate two or more internal input signals having different attributes, such as different swings, and the like. The two internal input signals are separately provided to two sub-amplifiers that operate in different regions in order to reduce third-order inter-modulation (IM3) distortion.

In an example, the amplifier 110A includes a saturation path 120A, a linear path 130A, and a swing adjustor 150A. These elements are coupled together as shown in FIG. 1A. The swing adjustor 150A adjusts the swing of the input signal. Then, the input signal is provided to the saturation path 120A to generate a first current based on the input signal, and the swing-adjusted input signal is provided to the linear path 130A to generate a second current based on the swing-adjusted input signal.

Specifically, the saturation path 120A includes a first main transistor (not shown) that is biased, for example, in a saturation region. In an embodiment, when the input signal has a relatively large input power, the first main transistor operates close to 1 dB compression point (P1dB). The first main transistor is suitably biased, such that the first current has a negative third-order coefficient corresponding to the swing of the input signal.

The linear path 130A includes a second main transistor (not shown) that is suitably biased in a linear region, such that the second current has a positive third-order coefficient corresponding to the swing of the swing-adjusted input signal. Thus, when the saturation path 120A and the linear path 130A drive the load 140A, the first current and the second current are combined. It is noted that in the FIG. 1A example, the combined current is pulled out of the load 140A. In another example (not shown), the combined current flows into the load 140A. The integration of the negative third-order coefficient over the swing of the input signal, and the integration of the positive third-order coefficient over the adjusted swing of the swing-adjusted input signal, offset each other, and thus the combined current has a reduce third-order inter-modulation (IM3) distortion. It is noted that the integration of the negative third-order coefficient, and the integration of the positive third-order coefficient can completely offset each other or partially offset.

In a comparison amplifier, when the input signal has a relatively large input power, the input signal is provided to both a saturation path and a linear path. Due to the large swing in the radio frequency, the linear path may have negative third-order coefficient some time. The integration of the third-order coefficient in the saturation path and the integration of the third-order coefficient in the linear path may have the same polarity, and cannot offset each other.

According to an aspect of the disclosure, the gain of the amplifier 110A is determined mostly by the saturation path 120A. In an example, when the amplifier 110A has a total gain of 10 dB, the saturation path 120A contributes about 9.7 dB, and the linear path 130A contributes about 0.3 dB. Thus, adjusting the swing of the input signal for the linear path 130A does not significantly affect the gain of the amplifier 110A.

It is noted that the saturation path 120A can be implemented by any suitable topology, such as a single common-source transistor, cascade transistors, triple cascade transistors, and the like.

It is also noted that the linear path 130A can be implemented by any suitable topology, such as a single common-source transistor, cascade transistors, triple cascade transistors, and the like.

The load 140A can be any suitable load, such as resistor load, LC resonator, inductor, and the like. The swing adjustor 150A can be implemented by any suitable circuit, such as capacitor divider, resistor divider, transformer, and the like.

Figure 1B:
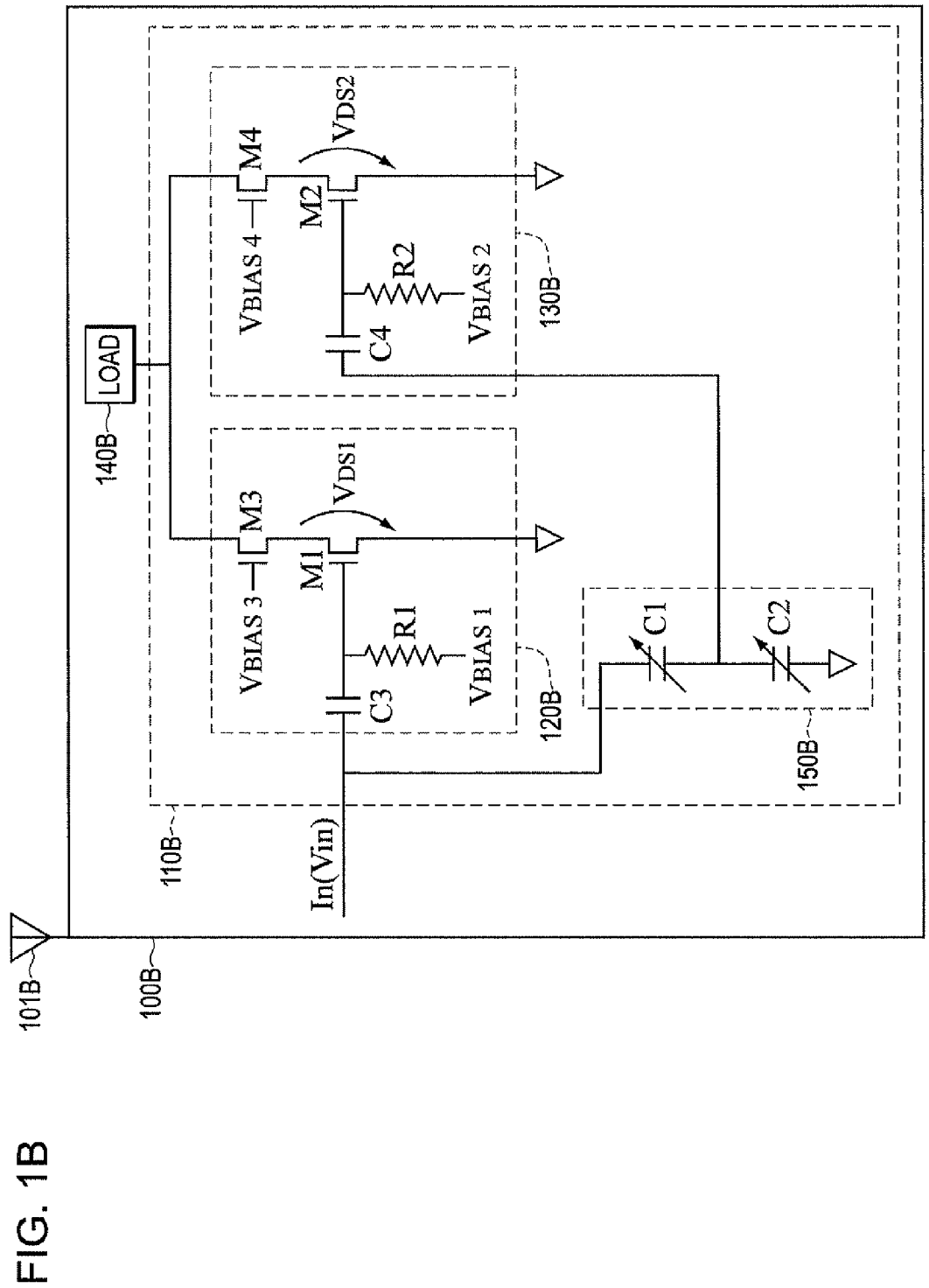
FIG. 1B shows a detailed block diagram of an apparatus example according to an embodiment of the disclosure.

FIG. 1B shows a detailed block diagram of an apparatus example 100B according to an embodiment of the disclosure. The apparatus 100E also utilizes certain components that are identical or equivalent to those used in the apparatus 100A; the description of these components has been provided above and will be omitted here for clarity purposes.

The swing adjustor 150B includes capacitors C1 and C2 configured as a capacitor divider for swing adjustment. C1 and C2 can be tuned to adjust a ratio for swing adjustment. The swing adjustor 150B receives the input signal, attenuates the swing of the input signal, and provides the swing-adjusted input signal to the linear path 130B.

The saturation path 120B includes two n-type metal-oxide-semiconductor (NMOS) transistors M1 and M3, a resistor R1, and a capacitor C3. M1 is the main transistor in the saturation path 120B. A bias voltage $V_{BIAS1}$ is applied to the gate of M1 via R1, the input signal is applied to the gate of M1 via C3. A bias voltage $V_{BIAS3}$ is applied to the gate of M3. The sizes of M1 and M3, and the bias voltage $V_{BIAS1}$ and $V_{BIAS3}$ are suitably designed to ensure that the main transistor M1 operates in the saturation region, for example, keeping the drain-source voltage $V_{DS1}$ larger than a specific value.

The linear path 130B includes two NMOS transistors M2 and M4, a resistor R2 and a capacitor C4. M2 is the main transistor in the linear path 130B. A bias voltage $V_{BIAS2}$ is applied to the gate of M2 via R2, the swing-adjusted input signal is applied to the gate of M2 via C4. A bias voltage $V_{BIAS4}$ is applied to the gate of M4. The sizes of M2 and M4, and the bias voltages $V_{BIAS2}$ and $V_{BIAS4}$ are suitably designed to ensure that the main transistor M2 operates in the linear region, for example, keeping the drain-source voltage $V_{DS2}$ smaller than a specific value.

Additionally, the linear paths 130A and 130B can be tuned from other aspects, such as bias point, a number of linear paths, and the like, to match, for example, the integration of the generated positive third-order coefficient with the integration of the negative third-order coefficient of the corresponding saturation paths 120A and 120B, in order to reduce IM3.

Figure 2:
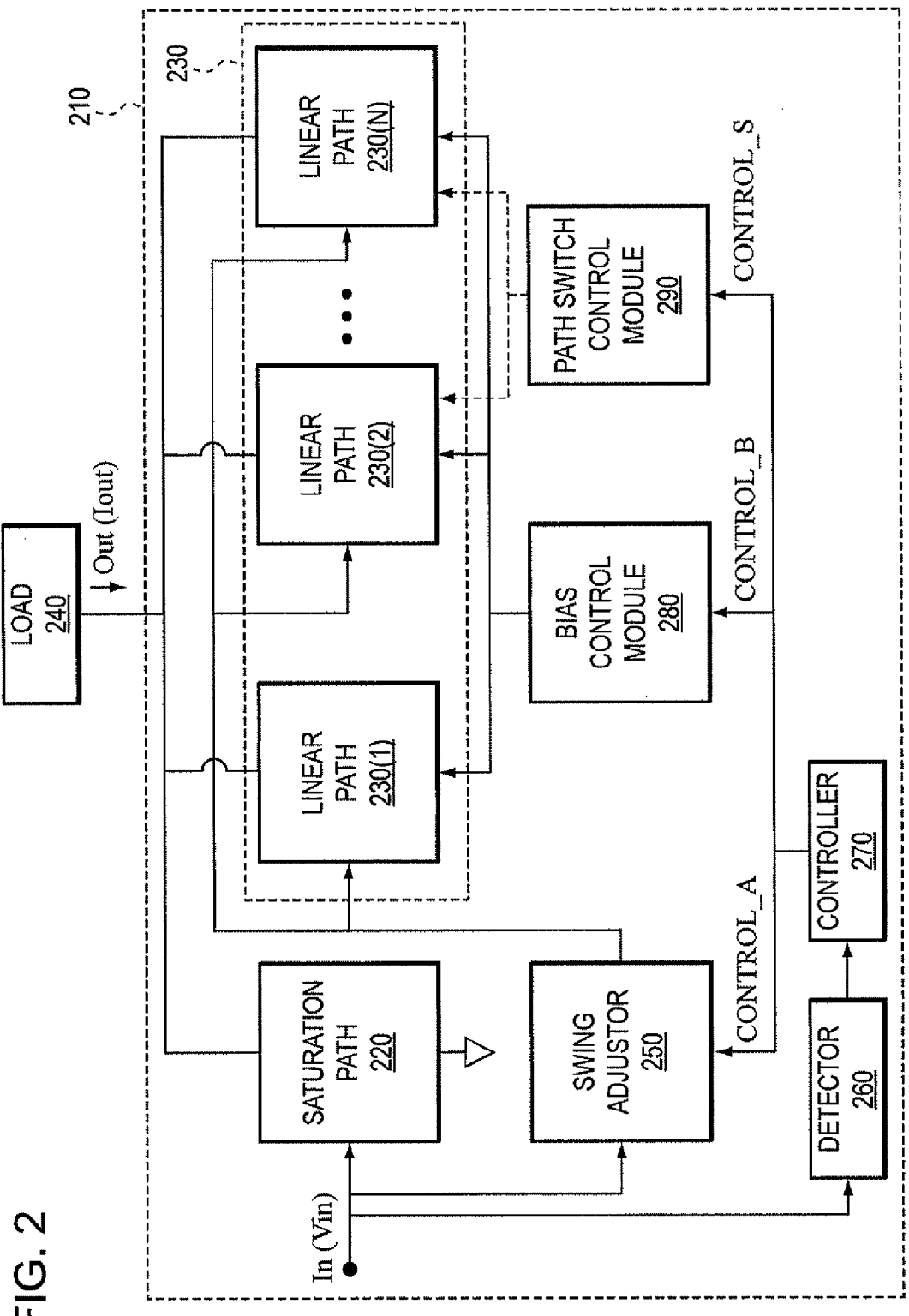
FIG. 2 shows a block diagram of an amplifier example according to an embodiment of the disclosure.

FIG. 2 shows a block diagram of an amplifier example 210 driving a load 240 according to an embodiment of the disclosure. The amplifier 210 receives an input voltage, and generates an output current to drive the load 240. The amplifier 210 includes a saturation path 220, a linear module 230, a swing adjustor 250, a bias control module 280, a path switch control module 290, a detector 260, and a controller 270.

The saturation path 220 includes a first main transistor (not shown) that is biased in a saturation region. The first main transistor receives the input voltage, and generates a first current having a negative third-order coefficient over the swing range of the input voltage. The saturation path 220 can be implemented by various topologies, such as a single common-source transistor, cascade transistors, triple cascade transistors, and the like.

The swing adjustor 250 suitably adjusts the swing of the input voltage at the radio frequency. In an embodiment, the swing adjustor 250 attenuates the swing of the input voltage based on a control signal CONTROL_A. For example, when CONTROL_A is zero, the swing adjustor 250 does not attenuate the swing of the input signal, when CONTROL_A is relatively large, the swing adjustor 250 attenuates the swing of the input signal with a relatively large attenuation ratio; and when CONTROL_A is relatively small, the swing adjustor 250 attenuates the swing of the input signal with a relatively small attenuation ratio. The swing adjustor 150 can be implemented by any suitable circuit, such as capacitor divider, resistor divider, transformer, and the like.

The linear module 230 receives the swing-adjusted input signal, and generates a second current having a positive third-order coefficient over the adjusted swing of the swing-adjusted input signal. When the second current and the first current are combined into the output current, the integration of the positive third-order coefficient completely offsets or partially offsets the integration of the negative third-order coefficient, and reduces the IM3 distortion in the output current.

The bias control module 280 provides a bias voltage, for example, to the linear module 230 to bias main transistors of the linear module 230 into a linear region. In an embodiment, the bias control module 280 adjusts the bias voltage based on a control signal CONTROL_B.

According to an embodiment of the disclosure, the linear module 230 includes multiple linear paths 230(1-N) that can be selectively coupled to the load 240. In the FIG. 2 example, a first linear path 230(1) is coupled to the load 240, and the rest of the linear paths 230(2-N) are selectively coupled to the load 240. In an example, each of the linear paths 230(2-N) includes a switch. When the switch is switched on, the corresponding linear path is coupled to the load 240, and contributes to the second current; when the switch is switched off, the corresponding linear path is decoupled from the load 240, and does not contribute to the second current.

The path switch control module 290 provides switch signals to control the switches in the linear paths 230(2-N). In an embodiment, the path switch control module 290 generates the switch signals based on a control signal CONTROL_S.

The detector 260 detects an input power of the input signal, and provides the detected input power to the controller 270. The detector 260 can use any suitable technique, such as peak detection, envelop detection, and the like, to detect the input power.

The controller 270 receives the detected input power and generates various control signals based on the input power. In an example, the controller 270 determines CONTROL_A to control the swing adjustor 250. In another example, the controller 270 determines CONTROL_B to control the bias voltage for the linear module 230. In another example, the controller 270 determines CONTROL_S to control the path switch control module 290. In an embodiment, the controller 270 includes a look-up table to store various control signals corresponding to the input power. The look-up table can be set-up based on various techniques, such as experiment, simulation, and the like.

According to an embodiment of the disclosure, the linear module 230 is configured to generate the second current with tunable positive third-order coefficient. Thus, when the integration of the negative third-order coefficient changes with the input power, the linear module 230 is suitably tuned to adjust the integration of the positive third-order coefficient, such that when second current is combined with the first current, the integration of the negative third-order coefficient offsets the integration of the positive third-order coefficient to reduce third-order inter-modulation (IM3) distortion.

The linear module 230 tunes the positive third-order coefficient by various techniques, such as tuning the swing attenuation ratio, tuning the bias point of the linear region, switching on or off linear paths 230(2-N), and the like.

During operation, for example, when the amplifier 210 receives the input signal, the input signal is provided to the saturation path 220 to generate the first current to drive the load 240. The first current has a negative third-order coefficient. The integration of the negative third-order coefficient varies with the input power. Further, the input power of the input signal is detected by the detector 260. Based on the detected input power, the controller 270 generates the control signals CONTROL_A, CONTROL_B, and CONTROL_S.

Based on CONTROL_A, the swing adjustor 250 attenuates the swing of the input signal, and provides the swing-attenuated input signal to the linear module 230. Based on CONTROL_B, the bias control module 280 provides a bias voltage to the linear module 230. Based on CONTROL_S, the path switch control module 290 provides the switch signals to the linear module 230 to switch on or off the linear paths 230(2-N). Thus, the linear module 230 generates the second current having a positive third-order coefficient as a function of the input power of the input signal. When the first current and the second current are combined, the integration of the positive third-order coefficient and the integration of the negative third-order coefficient suitably offset each other. It is noted that the amplifier 210 is dynamically tuned based on the input power, such that the IM3 can be effectively reduced at relatively large input power as well as across a relatively wide power range.

Figure 3:
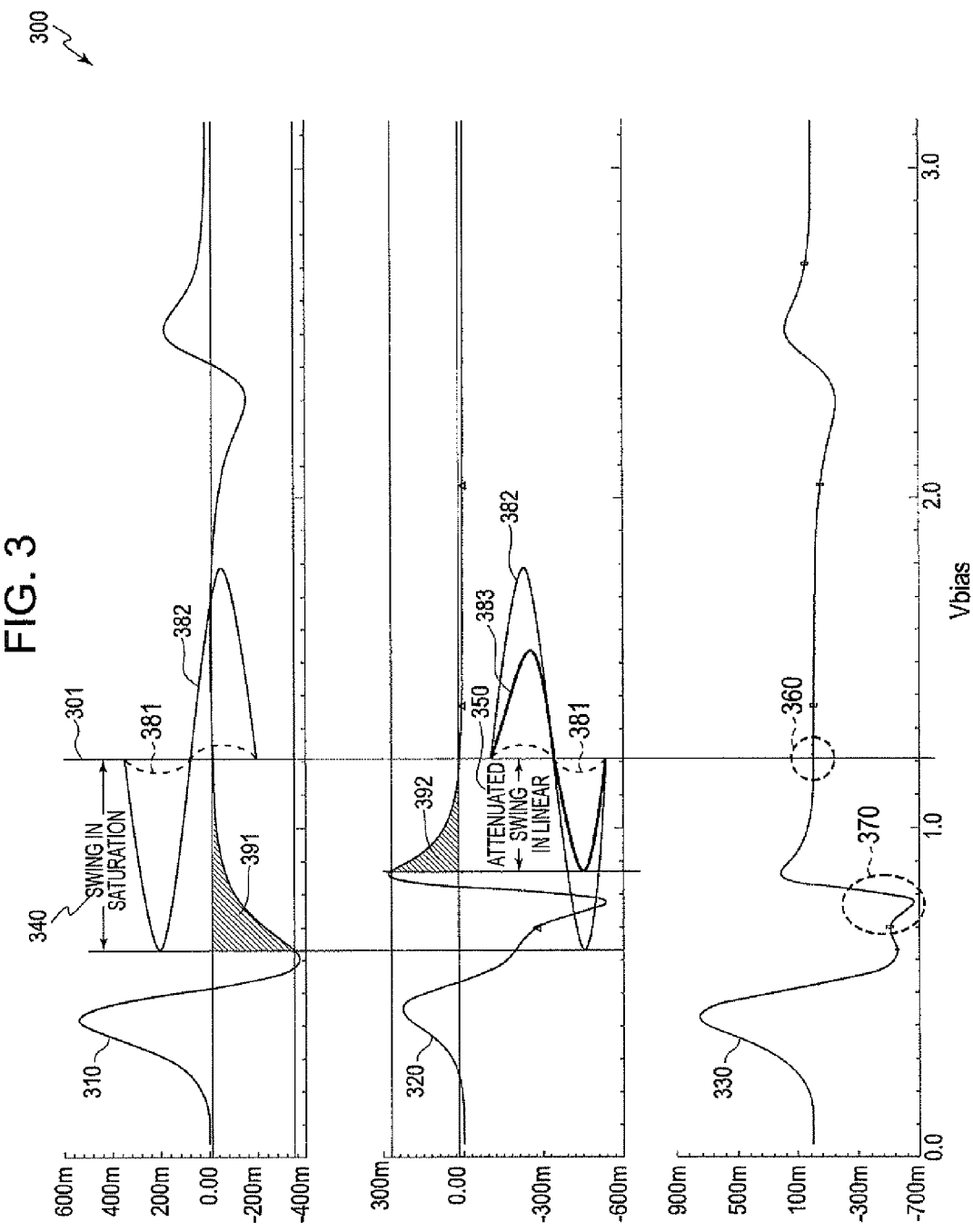
FIG. 3 shows a plot of a third-order coefficient cancellation example according to an embodiment of the disclosure.

FIG. 3 shows a plot of third-order coefficient cancellation example 300 according to an embodiment of the disclosure. The plot includes a first curve 310 of a third-order coefficient in a first current generated in a saturation path, a second curve 320 of a third-order coefficient in a second current generated in a linear path, and a third curve 330 that simply adds the first curve 310 and the second curve 320. The saturation path and the linear path are biased at a DC cancellation point 301 at which the third-order coefficient of the first curve 310 and the third-order coefficient of the second curve 320 completely cancel each other.

When an input signal has a relatively small swing 381, the simple addition that combines the first current and the second current offsets the third-order coefficient, as shown by 360. However, when the input signal has a relatively large swing 382, the simple addition that combines the first current and the second current does not effectively offset the third-order coefficient, as shown by 370, due to the reason that both the first curve 310 and the second curve 320 can be negative when the input signal swings far away from the DC cancellation point 301.

According to an embodiment of the disclosure, the swing of the input signal for the linear path is suitably adjusted, such as attenuated as shown by 383, such that the third-order coefficient in the second current is positive corresponding to the adjusted swing range of the swing-adjusted input signal. Then, when the first current and the second current are combined, the integration of the positive third-order coefficient in the second curve 320, as shown by 392, reduces the integration of the negative third-order coefficient in the first curve 310, as shown by 391. Thus, the combined current has a reduced third-order inter-modulation (IM3) distortion.

It is noted that the saturation path contributes most of the amplifier gain, such as 9.7 dB output of 10 dB, thus changes in the linear path does not significantly affect the amplifier gain. It is also noted that the linear path can be suitably configured from other aspects, such as bias point, a number of linear paths, and the like, to reduce the third-order inter-modulation distortion (IM3).

Figure 4A:
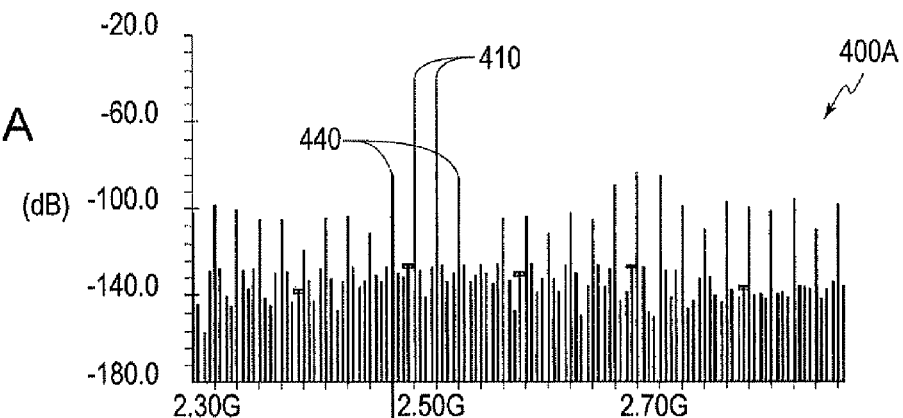
FIGS. 4A-4C show plots for third-order inter-modulation (IM3) reduction example according to an embodiment of the disclosure.
Figure 4B:
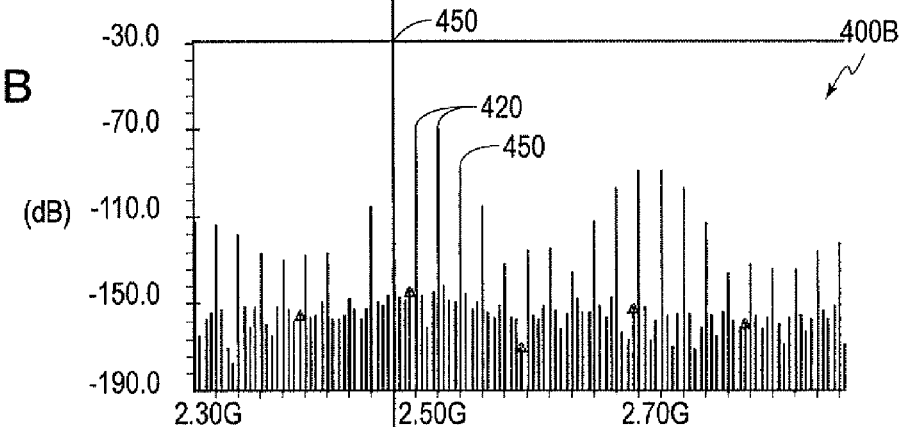
Figure 4C:
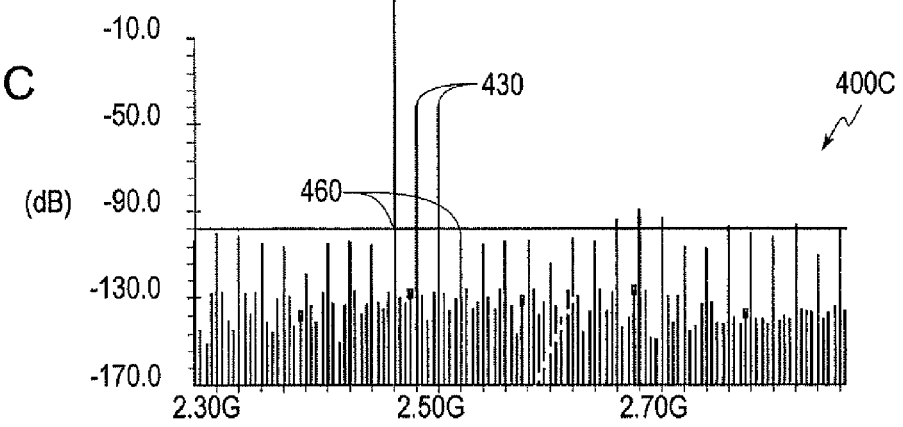

FIGS. 4A-4C show plots of third-order inter-modulation (IM3) distortion reduction example according to an embodiment of the disclosure. FIG. 4A shows a plot 400A of a first energy distribution spectrum in a first current generated by a saturation path. The saturation path receives an input signal having a relatively large swing and generates the first current based on the input signal. In FIG. 4A, 410 shows energy distribution in a presently used channel, and 440 shows energy spilled in immediately adjacent channels due to inter-modulations, such as third-order inter-modulation (IM3), and the like.

The input signal is then processed, such as swing-attenuated, to generate a swing-attenuated input signal. The swing-attenuated input signal is provided to a linear path to generate a second current. FIG. 4B shows a plot 400B of a second energy distribution spectrum in the second current generated by the linear path that amplifies the swing-attenuated input signal. In FIG. 4B, 420 shows energy distributed in the presently used channel, and 450 shows energy spilled in the immediately adjacent channels due to inter-modulations, such as third-order inter-modulation (IM3), and the like.

The first current and the second current are combined. FIG. 4C shows a plot 400C of a third energy distribution spectrum in the combined current. In FIG. 4C, 430 shows energy distributed in the presently used channel that is about the same as 410, and 460 shows energy spilled in the immediately adjacent channels due to inter-modulations that has more than 12 dB reduction from 440.

Figure 5A:
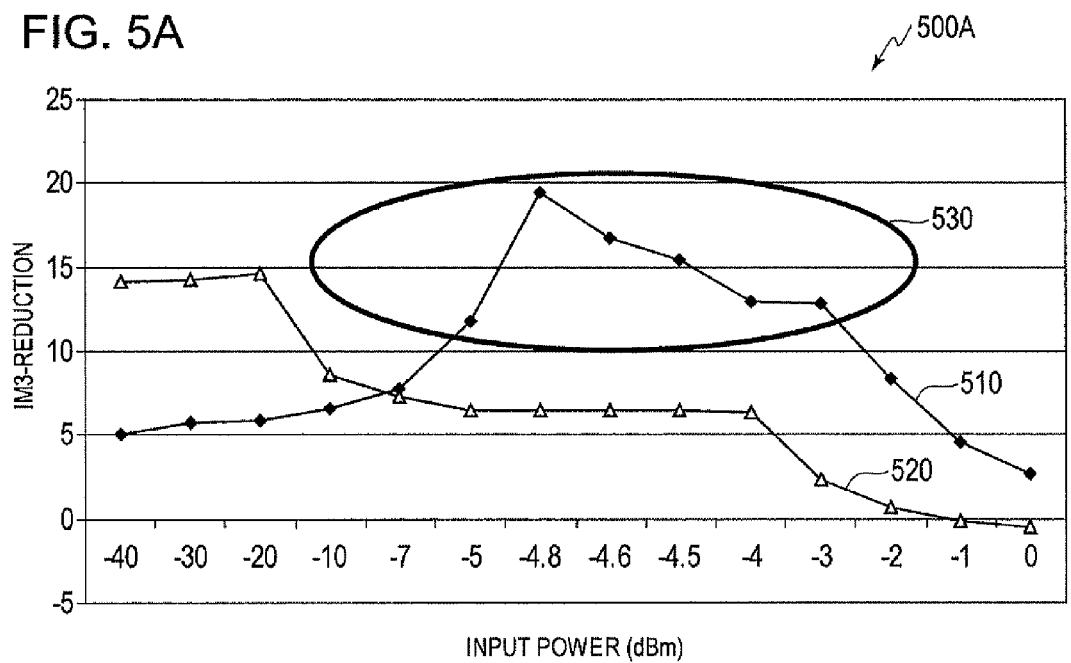
FIG. 5A shows a plot of IM3 reduction at relatively large signal power using swing attenuation according to an embodiment of the disclosure.

FIG. 5A shows a plot 500A of IM3 reduction at relatively large signal power using swing attenuation according to an embodiment of the disclosure. The plot 500A includes a first curve 510 of IM3 reduction in a first amplifier that uses swing attenuation, and a second curve 520 of IM3 reduction in a second amplifier that uses DC cancellation. The first amplifier receives an input signal, and provides the input signal to a saturation path of the first amplifier to generate a first current.

Further, the input signal is swing-attenuated. The swing-attenuated input signal is provided to a linear path of the first amplifier to generate a second current. The first current and the second current are combined to offset IM3.

The second amplifier receives an input signal, and provides the input signal to a saturation path and a linear path of the second amplifier to generate a first current and a second current. The first current and the second current are combined to reduce IM3. It is noted that the second amplifier is configured in a manner that the negative third-order coefficient in the first current and the positive third-order coefficient in the second current completely cancels each other at the DC of the input signal.

In FIG. 5A, the first amplifier has relatively high IM3 reduction when the input signal has a relatively large input power, as shown by 530.

According an embodiment of the disclosure, a swing adjustor is suitably controlled based on the input power of the input signal to achieve relatively high IM3 reduction over a wide range of input power. For example, when the input power of the input signal is lower than a threshold, the swing adjustor does not attenuate the input signal; and when the power of the input signal is higher than a threshold, the swing adjustor attenuates the input signal.

Figure 5B:
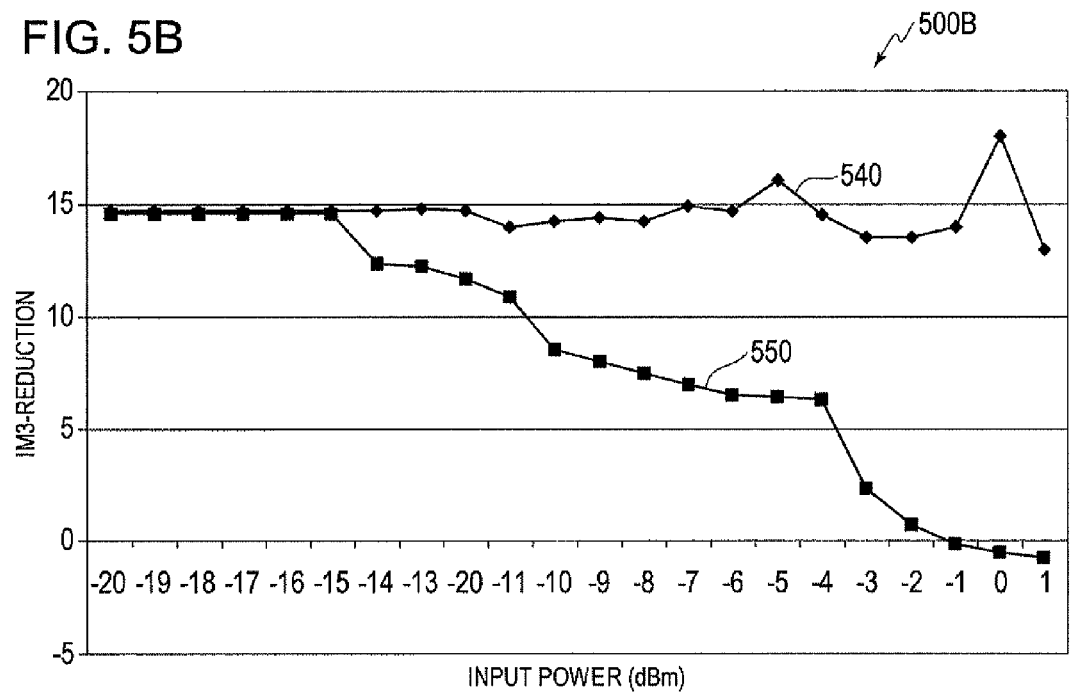
FIG. 5B shows a plot of IM3 reduction across a relatively large power range using dynamic attenuation according to an embodiment of the disclosure.

FIG. 5B shows a plot 500B of IM3 reduction across a relatively large power range using dynamic attenuation according to an embodiment of the disclosure. The plot 500B includes a first curve 540 of IM3 reduction in a first amplifier that uses dynamic attenuation based on input power, and a second curve 550 of IM3 reduction in a second amplifier that uses DC cancellation. The first amplifier receives an input signal, and provides the input signal to a saturation path of the first amplifier to generate a first current. Further, the input signal is swing-attenuated based on the input power of the input signal. The swing-attenuated input signal is provided to a linear path of the first amplifier to generate a second current. The first current and the second current are combined to offset IM3.

The second amplifier receives an input signal, and provides the input signal to a saturation path and a linear path of the second amplifier to generate a first current and a second current. The first current and the second current are combined to reduce IM3. It is noted that the second amplifier is configured in a manner that the negative third-order coefficient in the first current and the positive third-order coefficient in the second current completely cancels each other at the DC of the input signal.

In FIG. 5B, when the input power is relatively low, the first amplifier is suitably tuned, for example, to have substantially same configuration as the second amplifier, such that the first amplifier has substantially same IM3 reduction as the second amplifier. When the input power is relatively high, the first amplifier is suitably tuned based on the input power. For example, the attenuation ratio, the bias voltage, and a number of linear paths are changed based on the input power, such that the first amplifier has relatively high IM3 reduction across a relatively wide input power range.

FIG. 6 shows a table 600 of control signals vs. input power according to an embodiment of the disclosure. In an embodiment, the table 600 is included in a controller, such as the controller 270, to generate various control signals based on the input power. The table 600 includes an input power field 610, a CONTROL_A field 620, a CONTROL_B field 630, and a CONTROL_S field 630. Each row stores suitable values of CONTROL_A, CONTROL_B and CONTROL_S corresponding to a value of the input power.

Figure 7:
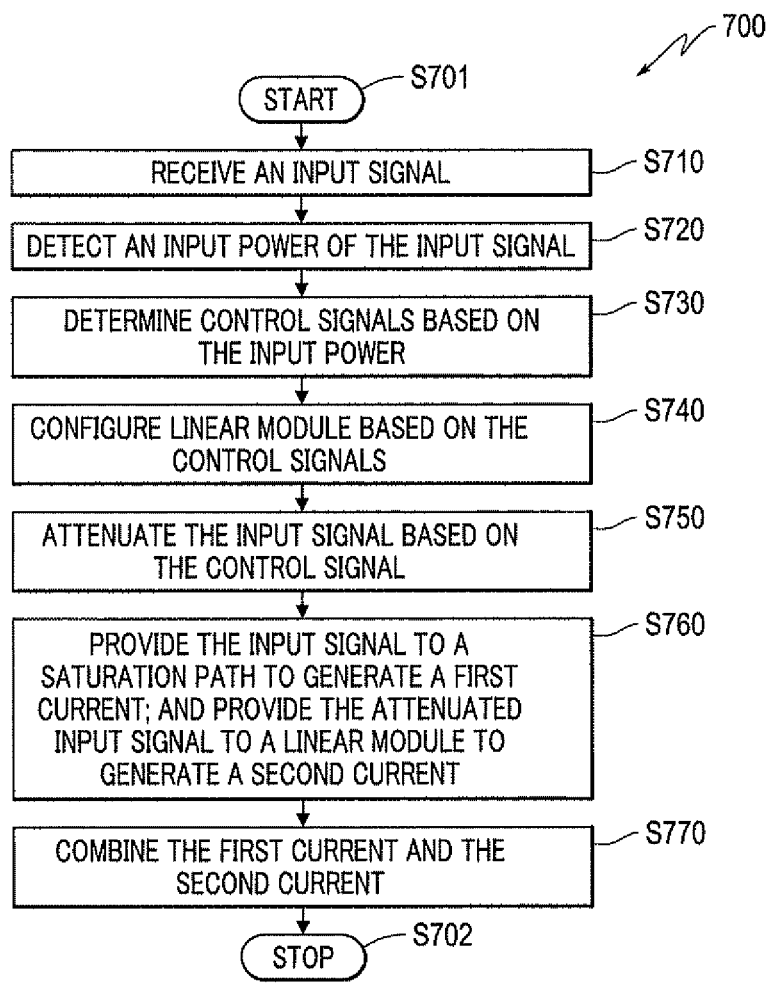
FIG. 7 shows a flow chart outlining a process example for an amplifier to amplify an input signal with an improved linearity according to an embodiment of the disclosure.

FIG. 7 shows a flow chart outlining a process example for the amplifier 210 to amplify an input signal with an improved linearity.

At S710, the amplifier 210 receives an input signal, such as Yin.

At S720, the detector 260 detects an input power of the input signal.

At S730, the controller 270 determines the control signals CONTROL_A, CONTROL_B, and CONTROL_S based on the input power. In an example, the controller 270 uses a look-up table, such as the table 600, to determine values of the control signals.

At S740, the linear module 230 is suitably configured based on the control signals CONTROL_B, and CONTROL_S. In an example, the bias control module 280 generates a bias voltage based on CONTROL_B, and provides the bias voltage to the linear module 230 to bias main transistors in the linear module 230. In another example, the path switch control module 290 generates switch signals based on CONTROL_S. The switch signals are provided to the linear paths 230(2-N) to respectively switch on or off the linear paths 230(2-N).

At S750, the swing adjustor 250 adjusts the swing of the input signal based on CONTROL_A. In an example, when the input power of the input signal is lower than a threshold, CONTROL_A controls the swing adjustor 250 not to adjust the swing of the input signal, and when the input power of the input signal is larger than the threshold, CONTROL_A controls the swing adjustor 250 to attenuate the swing of the input signal. In addition, CONTROL_A can be used to indicate an attenuation ratio to control the swing adjustor 250 to attenuate the swing of the input signal according to the attenuation ratio.

At S760, the input signal is provided to the saturation path 220 for generating the first current, and the swing-adjusted input signal is provided to the linear module 230 to generate the second current.

At S770, the first current and the second current are combined to reduce IM3. The process then proceeds to S799, and terminates.

It is noted that the process 700 can be suitably modified. In addition, some steps, such as S740 and S750, may happen at the same time or about same time.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An amplifier, comprising:
 a first path comprising a first transistor that operates in a saturation region to generate a first current in response to an input signal, the first current having a first polarity third-order coefficient;
 a second path comprising a second transistor that generates a second current in response to the input signal; and
 a drain bias circuit configured to bias a drain terminal of the second transistor separately from the first transistor such that the second transistor operates in a linear region to generate the second current having a second polarity third-order coefficient, the second current being combined with the first current to reduce a third-order intermodulation in the combined current.

2. The amplifier of claim 1, wherein:
a swing adjustor is configured to adjust a swing of the input signal; and
the second transistor is configured to operate based on the swing adjusted input signal.

3. The amplifier of claim 2, wherein the swing adjustor is configured to attenuate the swing of the input signal.

4. The amplifier of claim 2, further comprising:
a detector configured to detect an input power of the input signal; and
a controller configured to provide a control signal to the swing adjustor to adjust a ratio based on the input power of the input signal.

5. The amplifier of claim 1, further comprising:
a gate bias control module configured to provide a gate bias to at least the second path.

6. The amplifier of claim 5, further comprising:
a detector configured to detect an input power of the input signal; and
a controller configured to provide a control signal to the gate bias control module to adjust the gate bias based on the input power of the input signal.

7. The amplifier of claim 1, further comprising:
a third path comprising a third transistor that generates a third current in response to the input signal; and
a path switch control module configured to couple or decouple the third path with the first path and the second path.

8. The amplifier of claim 7, further comprising:
a detector configured to detect an input power of the input signal; and
a controller configured to provide a control signal to the path switch control module to couple or decouple the third path based on the input power of the input signal.

9. A method for improving linearity of an amplifier, comprising:
receiving an input signal;
generating by a first path a first current in response to the input signal, the first path including a first transistor that operates in a saturation region, the first current having a first polarity third-order coefficient corresponding to the input signal;
biasing a drain terminal of a second transistor in a second path separately from the first transistor such that the second transistor operates in a linear region;
generating by the second path a second current in response to the input signal, the second current having a second polarity third-order coefficient; and
combining the first current with the second current to reduce a third-order inter-modulation distortion in the combined current.

10. The method of claim 9, wherein generating by the second path the second current in response to the input signal further comprises:
adjusting a swing of the input signal; and
generating by the second path the second current based on the swing adjusted input signal.

11. The method of claim 10, wherein adjusting the swing of the input signal further comprises:
attenuating the swing of the input signal.

12. The method of claim 10, further comprising:
detecting an input power of the input signal; and
adjusting the swing of the input signal based on the input power of the input signal.

13. The method of claim 9, further comprising:
adjusting a gate bias in the second path.

14. The method of claim 13, further comprising:
detecting an input power of the input signal; and
adjusting the gate bias in the second path based on the input power of the input signal.

15. The method of claim 9, further comprising:
switching on and off to couple and decouple, respectively, a third path that generates a third current.

16. The method of claim 15, further comprising:
detecting an input power of the input signal; and
switching on and off to couple and decouple the third path to and from, respectively, the load based on the input power of the input signal.

17. An apparatus having a power amplifier, the power amplifier comprising:
a first path comprising a first transistor that operates in a saturation region to generate a first current in response to an input signal, the first current having a first polarity third-order coefficient;
a second path comprising a second transistor that generates a second current in response to the input signal; and
a drain bias circuit configured to bias a drain terminal of the second transistor separately from the first transistor such that the second transistor operates in a linear region to generate the second current having a second polarity third-order coefficient, the second current being combined with the first current to reduce a third-order inter-modulation in the combined current.

18. The apparatus of claim 17, wherein:
a swing adjustor is configured to adjust a swing of the input signal; and
the second transistor is configured to operate based on the swing adjusted input signal.

19. The apparatus of claim 17, wherein the power amplifier further comprises:
a gate bias control module configured to provide a gate bias to at least the second path.

20. The apparatus of claim 17, wherein the power amplifier further comprises:
a third path comprising a third transistor that generates a third current in response to the input signal; and
a path switch control module configured to couple or decouple the third path with the first path and the second path.

* * * * *